(12) United States Patent
Zuraski, Jr. et al.

(10) Patent No.: US 6,560,740 B1
(45) Date of Patent: May 6, 2003

(54) APPARATUS AND METHOD FOR PROGRAMMABLE BUILT-IN SELF-TEST AND SELF-REPAIR OF EMBEDDED MEMORY

(75) Inventors: Gerald D. Zuraski, Jr., Austin, TX (US); Timothy J. Wood, Austin, TX (US); Raghuram S. Tupuri, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/366,444

(22) Filed: Aug. 3, 1999

(51) Int. Cl.$^7$ ................................................ G01R 31/28
(52) U.S. Cl. ...................................... 714/733; 714/727
(58) Field of Search ................................ 365/201, 200; 714/733, 727, 710, 718

(56) References Cited

U.S. PATENT DOCUMENTS

| | | |
|---|---|---|
| 4,969,148 A | 11/1990 | Nadeau-Dostie et al. |
| 5,224,101 A | 6/1993 | Popyack, Jr. |
| 5,325,367 A | 6/1994 | Dekker et al. |
| 5,375,091 A | 12/1994 | Berry, Jr. et al. |
| 5,416,783 A | 5/1995 | Broseghini et al. |
| 5,450,551 A | 9/1995 | Amini et al. |
| 5,471,482 A | 11/1995 | Byers et al. |
| 5,577,050 A | * 11/1996 | Bair et al. ................... 714/710 |
| 5,661,732 A | 8/1997 | Lo et al. |
| 5,748,640 A | 5/1998 | Jiang et al. |
| 5,764,878 A | * 6/1998 | Kablanian et al. .............. 714/7 |
| 5,796,745 A | 8/1998 | Adams et al. |
| 5,805,789 A | 9/1998 | Huott et al. |
| 5,859,804 A | 1/1999 | Hedberg et al. |
| 5,946,246 A | * 8/1999 | Jun et al. ..................... 365/201 |
| 5,974,579 A | * 10/1999 | Lepejian et al. ............. 714/733 |
| 6,067,262 A | * 5/2000 | Irrinki et al. ................ 365/201 |

OTHER PUBLICATIONS

Dekker, et al., "A Realistic Fault Model and Test Algorithms for Static Random Access Memories", IEEE, 1990, 6 pages.

Sayah et al., "Test Scheduling for High Performance VLSI System Implementations," International Test Conference 1988 Proceedings, Washington, Sep. 12–14, 1988, No. 1988, Institute of Electrical and Electronics Engineers, pp. 421–430.

Bhavsar, et al. "Testability Strategy of the Alpha AXP 21164 Microprocessor", Digital Equipment Corp. Semiconductor Operations, Hudson, MA, IEEE, 1994, pp. 50–59.

* cited by examiner

*Primary Examiner*—Albert DeCady
*Assistant Examiner*—Mujtaba Chaudry
(74) *Attorney, Agent, or Firm*—Lawrence J. Merkel; Meyertons, Hood, Kivlin, Kowert & Goetzel, P.C.

(57) ABSTRACT

An apparatus and method are presented for programmable built-in self-test (BIST) and built-in self-repair (BISR) of an embedded memory (i.e., a memory formed with random logic upon a semiconductor substrate). A semiconductor device may include a memory unit, a BIST logic unit coupled to the memory unit, and a master test unit coupled to the BIST logic unit and the memory unit. The memory unit stores data input signals in response to a first set of address and control signals, and provides the stored data input signals as data output signals in response to a second set of address and control signals. The master test unit provides the memory test pattern to the BIST logic unit and generates the first and second sets of address and control signals. The BIST logic unit stores the memory test pattern, produces the data input signals dependent upon the memory test pattern, provides the data input signals to the memory unit, receives the data output signals from the memory unit, and compares the data output signals to the data input signals to form BIST results. The BIST system may perform a hardwired BIST routine when an asserted RESET signal is received by the semiconductor device and/or a programmable BIST routine under software control. The BIST logic unit may include a redundant memory structure, and may be configured to functionally replace a defective memory structure of the memory unit with one of the redundant memory structures dependent upon the BIST results.

21 Claims, 12 Drawing Sheets

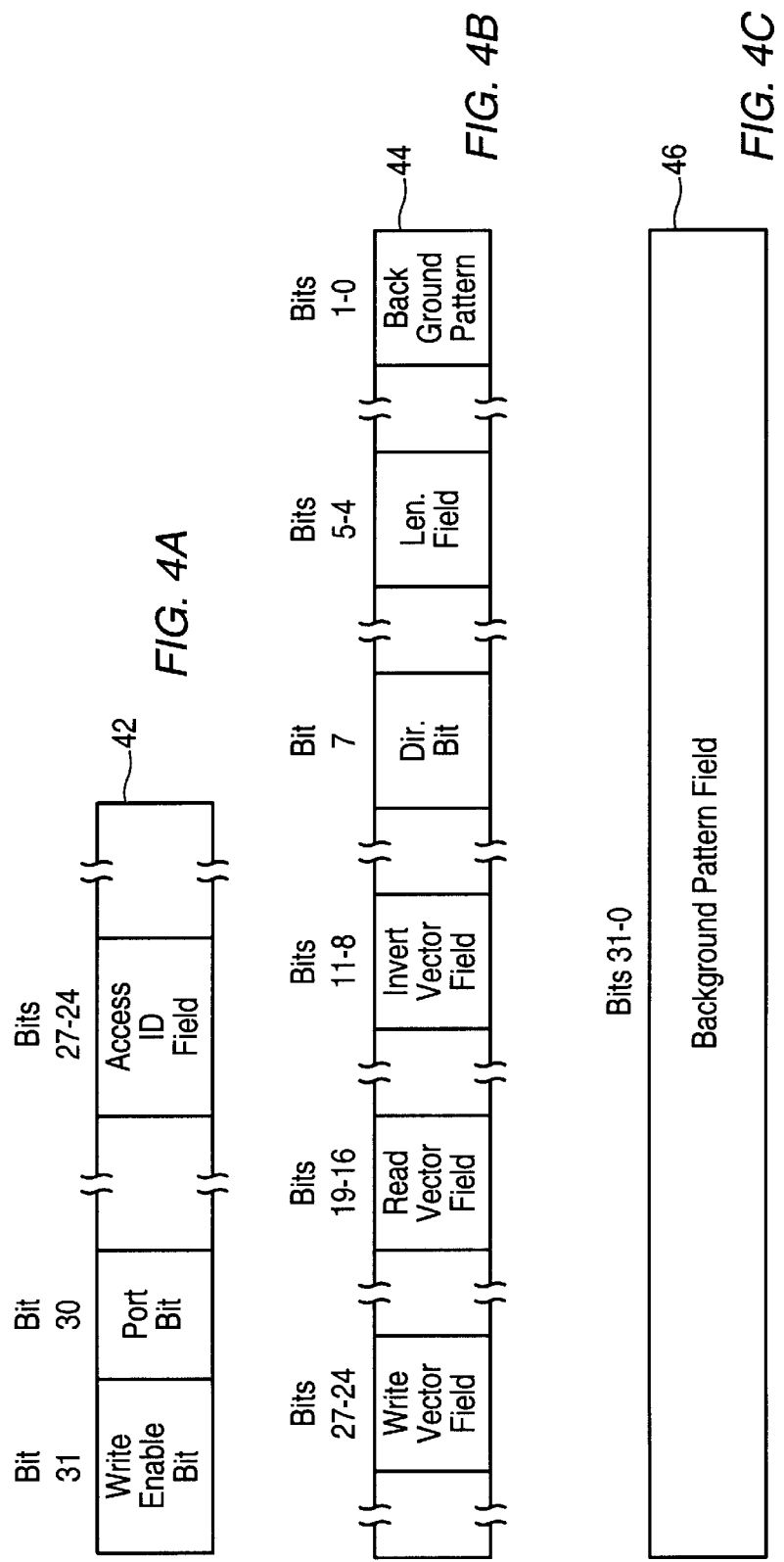

APPARATUS AND METHOD FOR PROGRAMMABLE BUILT-IN SELF-TEST AND SELF-REPAIR OF EMBEDDED MEMORY

BACKGROUND OF THE INVENTION

1. Field of the Invention

This invention relates to integrated circuit testing and repairable memory arrays, and more particularly to built-in self-test (BIST) circuits and methods implemented on integrated circuits for testing embedded memory arrays and the use of BIST data for guiding repair of the embedded memory arrays.

2. Description of the Related Art

Advances in integrated circuit fabrication technology continue to enhance the ability to form increasingly more circuitry upon integrated circuit chips. As the complexity of circuitry formed upon chips increases, the complexity of the testing required to ensure the circuitry functions correctly also increases. However, conventional testing using external test equipment is made extremely difficult as much of the circuitry formed on integrated circuit chips is typically not controllable or observable from input/output (I/O) pads. This is especially true of memory arrays formed along with random logic circuitry upon integrated circuit chips (i.e., embedded memory arrays). A solution to the chip testing problem increasingly being adopted is to incorporate testing circuitry along with the operational circuitry upon the integrated circuit chips themselves. Built-in self-test (BIST) circuitry is one example of such testing circuitry. Array BIST (ABIST) circuitry is commonly used to test proper operation of embedded memory arrays.

Deterministic testing of a memory array allows each and every memory cell of the memory array to be tested in view of one or more fault models. Some known deterministic ABIST circuits embody fixed state machines and store or generate selected test patterns. Such hardwired ABIST circuits must be modified to incorporate additional testing capabilities. For example, logic circuitry used to form the state machine may have to be redesigned to accommodate a new testing algorithm. Circuitry used to generate a test pattern must be modified to generate a different test pattern, and stored patterns must be altered to allow different test patterns to be used during testing. Most importantly, ABIST circuitry typically cannot be modified after chip fabrication, meaning that a given chip can only test an embedded memory array with the testing capabilities embodied within the ABIST circuitry when the chip was fabricated.

Other known types of ABIST circuits allow testing patterns to be serially scanned into an internal register prior to testing. For example, circuitry used to implement Joint Test Action Group (JTAG) boundary scan testing may also be used to serially scan in a testing pattern for ABIST. However, external circuitry must generate and/or provide the testing pattern, adding to the cost and complexity of the ABIST system. In addition, hardwired portions of the ABIST circuitry may still need to be redesigned to accommodate a new testing algorithm.

Memory cells of memory arrays are typically arranged in orthogonal rows and columns. Embedded memory arrays occupying sufficient chip area to impact chip yield are typically fabricated with redundant rows and/or columns. Following chip fabrication, rows and/or columns of the memory array which do not function correctly may be replaced by the redundant rows and/or columns, thus repairing the memory array and improving chip yield. Replacement mechanisms include current-blown fuses and laser-blown fuses. Various built-in self-repair (BISR) techniques use fault location information from BIST circuits to automatically replace rows and/or columns of the memory array which do not function correctly with redundant rows and/or columns, thus performing automatic memory array repair. BISR eliminates the need for external equipment (e.g., a laser) in order to effectuate memory array repair.

It would thus be desirable to have a programmable BIST system for functionally testing embedded memory arrays. Such a programmable BIST system would not require hardware modification to implement additional testing capabilities (e.g., new testing algorithms). The programmable BIST system may provide fault location information in addition to fault detection data, and the fault location information may be used to guide repair of the embedded memory arrays.

SUMMARY OF THE INVENTION

An apparatus and method are presented for programmable built-in self-test (BIST) and built-in self-repair (BISR) of an embedded memory (i.e., a memory formed with random logic upon a semiconductor substrate). A semiconductor device including a memory unit may also include a BIST system comprising a BIST logic unit coupled to the memory unit and a master test unit coupled to the BIST logic unit. The master test unit is further coupled to the memory unit. The memory unit receives address signals, data input signals, and control signals. The memory unit stores the data input signals in response to a first set of address and control signals, and provides the stored data input signals as data output signals in response to a second set of address and control signals. The BIST logic unit is configured to store a memory test pattern (e.g., multiple binary digits forming a pattern of 1s and/or 0s). For example, the background pattern described below may be a type of memory test pattern. During BIST, the master test unit provides the memory test pattern to the BIST logic unit and generates the first and second sets of address and control signals. The BIST logic unit produces the data input signals dependent upon the memory test pattern, provides the data input signals to the memory unit, receives the data output signals from the memory unit, and compares the data output signals to the data input signals to form BIST results.

The BIST system may be configured to perform a hardwired BIST routine and/or a programmable BIST routine. The BIST system may perform the hardwired BIST routine when an asserted RESET signal is received by the semiconductor device, and may perform the programmable BIST routine under software control. The master test unit may include a hardwired BIST table for storing unalterable BIST control data and an unalterable memory test pattern. When the RESET signal is asserted, the master test unit may retrieve the unalterable BIST control data and the unalterable memory test pattern from the hardwired BIST table, provide the unalterable memory test pattern to the BIST logic unit, and generate the first and second sets of address and control signals according to the unalterable BIST control data.

The semiconductor device may further include a special register block. The special register block may include one or more addressable registers for storing a programmable memory test pattern, BIST control data, and an access ID code, and the master test unit may be coupled to the special register block. When a predetermined access ID code is stored within the one or more addressable registers, the master test unit may retrieve the programmable memory test pattern and the BIST control data from the one or more addressable registers, provide the programmable memory test pattern to the BIST logic unit, and generate the first and second sets of address and control signals according to the BIST control data.

The memory unit includes multiple memory cells. During the hardwired and/or the programmable BIST routines, the master test unit may generate the first and second sets of address and control signals such that a data input signal is stored within and retrieved from each of the of memory cells of the memory unit at least once. As a result, each and every memory cell of the memory unit is functionally tested.

The memory unit may include multiple copies of a memory structure (e.g., columns, rows, etc.) The BIST logic unit may include one or more redundant memory structures, and the BIST logic unit may be configured to functionally replace a defective memory structure of the memory unit with one of the redundant memory structures dependent upon the BIST results. For example, the BIST logic unit may include one or more redundant rows, and the BIST logic unit may be configured to functionally replace a defective row of the memory unit with one of the redundant rows dependent upon the BIST results.

A microprocessor is described including a CPU core for executing instructions, multiple memory units (e.g., separate instruction and data caches), multiple BIST logic units each coupled to a different one of the memory units, a master test unit coupled to the BIST logic units and to the memory units, and the special register block described above coupled between the CPU core and the master test unit. During instruction execution, the CPU core produces a memory test pattern and stores the memory test pattern within the one or more addressable register of the special register block. The master test unit retrieves the memory test pattern from the special register block, provides the memory test pattern to each of the BIST logic units, and generates the first and second sets of address and control signals. Each BIST logic unit receives the memory test pattern, stores the memory test pattern within a background register, and produces the data input signals dependent upon the memory test pattern. Each BIST logic unit provides the data input signals to the memory unit coupled thereto, receives the data output signals from the memory unit, and compares the data output signals to the data input signals to form BIST results.

The CPU core may produce an access ID code during instruction execution and store the access ID code within the one or more addressable registers of the special register block. When the CPU core stores a predetermined access ID code within the one or more addressable registers, the master test unit may retrieve the memory test pattern from the special register block, provide the memory test pattern to each of the BIST logic units, and generate the first and second sets of address and control signals. The CPU core may also produce BIST control data during instruction execution and store the BIST control data within the one or more addressable registers. The master test unit may retrieve the BIST control data from the one or more addressable registers and generate the first and second sets of address and control signals according to the BIST control data.

Each memory unit of the microprocessor may include multiple copies of a memory structure as described above. Each BIST logic unit may include one or more redundant memory structures, and may be configured to functionally replace a defective memory structure of the memory unit coupled thereto with one of the redundant memory structures dependent upon the BIST results. For example, each memory unit may include multiple row structures. Each BIST logic unit may include one or more redundant row structures, and may be configured to functionally replace a defective row structure of the memory unit coupled thereto with one of the redundant row structures dependent upon the BIST results.

A method for testing a memory unit of a semiconductor device includes storing test data within one or more registers of the semiconductor device, wherein the test data includes a memory test pattern. A predetermined value is then written into a portion of the one or more registers in order to initiate testing of the memory unit. The memory test pattern is retrieved from the one or more registers and used to produce data input signals. The data input signals are provided to the memory unit such that the data input signals are stored within the memory unit. Data output signals are retrieved from the memory unit and compared to the data input signals in order to produce a test result.

A computer system is described including the above microprocessor. The computer system may include a bus coupled to the microprocessor and a peripheral device coupled to the bus. The bus may be a peripheral component interconnect (PCI) bus, and the peripheral device may be, for example, a network interface card, a video accelerator, an audio card, a hard disk drive, or a floppy disk drive. Alternately, the bus may be an extended industry standard architecture (EISA)/industry standard architecture (ISA) bus, and the peripheral device may be, for example, a modem, a sound card, or a data acquisition card.

BRIEF DESCRIPTION OF THE DRAWINGS

Other objects and advantages of the invention will become apparent upon reading the following detailed description and upon reference to the accompanying drawings in which:

FIGS. 4a–c are diagrams of exemplary embodiments of the respective address/control register, configuration register, and background register of FIG. 3;

Figure 1:
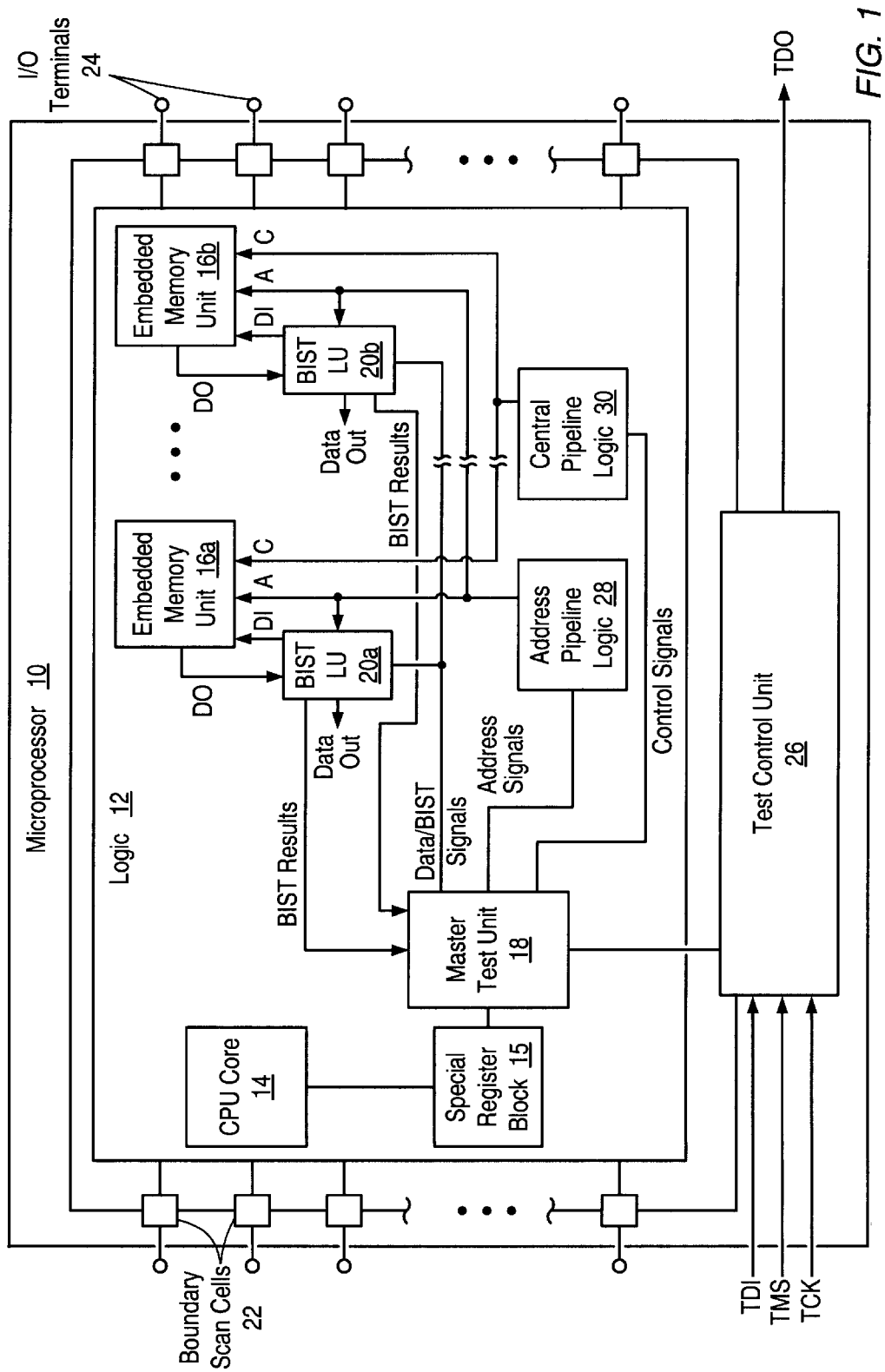
FIG. 1 is a block diagram of one embodiment of a microprocessor including a CPU core, a special register block, multiple embedded memory units, and a built-in self-test (BIST) system, wherein the BIST system includes a master test unit coupled to multiple BIST logic units (LUs), and wherein each BIST logic unit is coupled to a different one of the embedded memory units.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 1 is a block diagram of one embodiment of a microprocessor 10 including logic 12, wherein logic 12 includes a CPU core 14, a special register block 15, multiple embedded memory units 16a–b, and a built-in self-test (BIST) system. The BIST system includes a master test unit 18 and multiple BIST logic units (LUs) 20a–b. BIST logic units 20a–b are coupled to respective embedded memory units 16a–b, and master test unit 18 is coupled to BIST logic units 20a–b and to embedded memory units 16a–b. Master test unit 18 generates address signals and control signals for testing embedded memory units 16a–b, and BIST logic units 20a–b generate data signals for testing respective embedded memory units 16a–b. Embedded memory unit 16a may be, for example, an instruction cache of microprocessor 10, and embedded memory unit 16b may be, for example, a data cache of microprocessor 10.

Microprocessor 10 is configured to implement boundary scan testing of logic 12 (e.g., Joint Test Action Group or JTAG boundary scan testing according to IEEE Standard 1149.1-1990). As such, microprocessor 10 includes multiple boundary scan cells 22 coupled between logic 12 and I/O terminals 24. Boundary scan cells 22 are controlled by a test control unit 26 of the boundary scan test system. Master test unit 18 of the BIST system controls BIST logic units 20a–b and is coupled to test control unit 26 and to special register block 15.

The BIST system is capable of performing a hardwired BIST routine and a programmable BIST routine. The hardwired BIST routine involves the use of hardwired test data stored within master test unit 18, and may be performed automatically following assertion of a RESET signal received by the microprocessor via an I/O terminal 24 (e.g., following application of electrical power to microprocessor 10). The programmable BIST routine involves the use of programmable test data stored within special register block 15, and may be initiated by software instructions executed by CPU core 14. CPU core 14 is coupled to special register block 15 as shown in FIG. 1. Prior to initiation of the programmable BIST routine, CPU core 14 may store the programmable test data within addressable registers of special register block 15 in response to software instructions. During the programmable BIST routine, master test unit 18 may retrieve and use the programmable test data stored within special register block 15.

The BIST system generates address, data, and control signals, and couples the address, data, and control signals to embedded memory units 16a–b during BIST in order to functionally test each and every memory location within embedded memory units 16a–b. The address signals (A) generated by master test unit 18 are coupled to BIST logic units 20a–b via address pipeline logic 28, and the control signals (C) generated by master test unit 18 are coupled to BIST logic units 20a–b via control pipeline logic 30.

During BIST, master test unit 18 provides background pattern information to BIST logic units 20, and BIST logic units 20 store the background pattern information. A background pattern includes multiple binary digits forming a pattern of 1s and/or 0s. The background pattern is dependent upon a selected type of memory test. Various types of memory tests (e.g., 0-1 test, checkerboard test, columns and bars, sliding diagonal, walking 1s and 0s, galloping 1s and 0s, march test, etc.) are well known in the art. In a preferred embodiment, master test unit 18 provides bits of the background pattern to BIST logic units 20 one after another in serial fashion.

BIST logic units 20a–b generate data input (DI) signals based upon the stored background pattern and provide the data input signals to respective embedded memory units 16a–b. BIST logic units 20 may manipulate (e.g., invert) the bits of the stored background pattern in order to produce the data signals. BIST operations will be explained in more detail below. Following BIST, each BIST logic unit 20 provides BIST results to master test unit 18. The combined BIST results may be retrieved from microprocessor 10 via test control unit 26.

Embedded memory units 16a–b include multiple memory cells arranged in orthogonal rows and columns, and BIST logic units 20a–b include redundant memory cells arranged in rows and/or columns (i.e., redundant rows and /or columns) for respective embedded memory units 16a–b. Following fabrication of microprocessor 10, rows and/or columns of embedded memory units 16a–b which do not function correctly may be replaced by the redundant rows and/or columns within respective BIST logic units 20a–b, thus repairing embedded memory units 16a–b and improving the manufacturing yield of microprocessor 10. During normal operation of microprocessor 10, embedded memory units 16a–b provide data output (DO) signals to respective BIST logic units 20a–b, and BIST logic units 20a–b produce DATA OUT signals for respective embedded memory units 16a–b. The DATA OUT signals may be dependent upon the contents of enabled redundant rows and/or columns within BIST logic units 20a–b.

A brief summary of boundary scan testing, which is well known in the art, is presented herein for completeness.

During normal operation of microprocessor 10, signals upon I/O terminals 24 flow to and from logic 12 unimpeded. During boundary scan testing, test control unit 26 configures boundary scan cells 22 to form a serial "scan chain" surrounding logic 12. Input values, produced by external circuitry, are shifted through the scan chain, then applied to logic 12. Output values produced by logic 12 are captured by a portion of boundary scan cells 22, shifted out through the scan chain, and compared to expected values.

Microprocessor 10 of FIG. 1 includes four additional terminals in order to accomplish boundary scan testing: a test data input (TDI) terminal, a test data output (TDO) terminal, a test mode select (TMS) terminal, and a test clock (TCK) terminal. Test control unit 26 receives a TDI signal via the TDI terminal, a TMS signal via the TMS terminal, and a TCK signal via the TCK terminal. The TDI signal conveys test input values to test control unit 26, and test control unit 26 provides the input values to boundary scan cells 22. The TMS signal is a control signal which determines the operating mode of test control unit 26 and/or master test unit 18. The TCK signal synchronizes the operations of test control unit 26 and boundary scan cells 22. Test control unit 26 drives the TDO terminal with a TDO signal conveying test data obtained from logic 12 during testing and/or BIST results. It is noted that microprocessor 10 may include other terminals for boundary scan testing.

Figure 2:
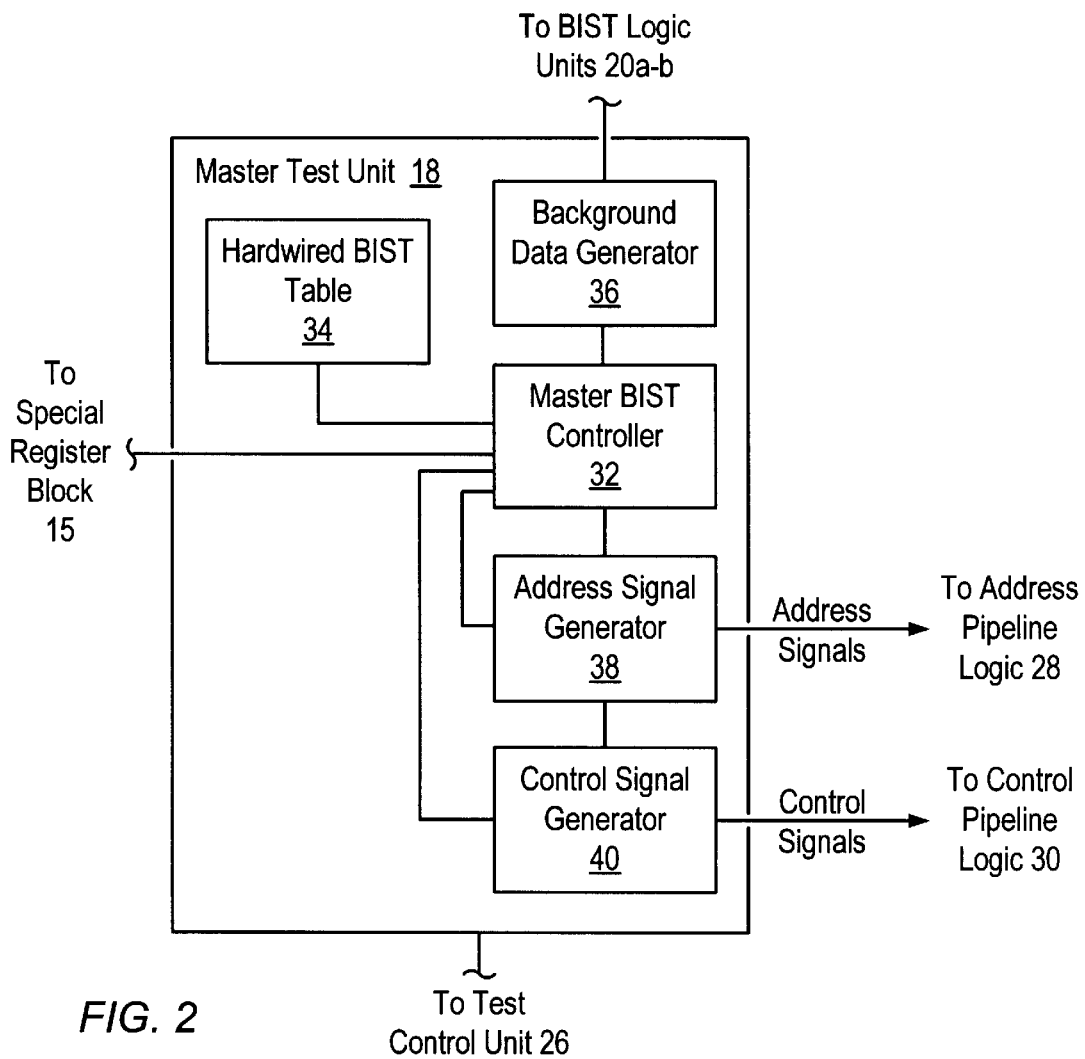
FIG. 2 is a block diagram of one embodiment of the master test unit of FIG. 1, wherein the master test unit includes a master BIST controller coupled to a hardwired BIST table, a background data generator, an address signal generator, and a control signal generator.

FIG. 2 is a block diagram of one embodiment of master test unit 18 of FIG. 1, wherein master test unit 18 includes a master BIST controller 32 coupled to a hardwired BIST table 34, a background data generator 36, an address signal generator 38, and a control signal generator 40. Master BIST controller 32 reads test data from either hardwired BIST table 34 (during the hardwired BIST routine) or from the addressable registers within special register block 15 (during the programmable BIST routine). The test data may include BIST control data and a background pattern. The BIST control data and background pattern stored within BIST table 34 are hardwired (i.e., unalterable), while the BIST control data and background pattern stored within the addressable registers within special register block 15 are programmable.

Master BIST controller 32 provides the background pattern to background data generator 36, and background data generator 36 transmits the background pattern to BIST logic units 20a–b. Address signal generator 38 generates address signals (A) during BIST and provides the address signals to BIST logic units 20a–b via address pipeline logic 28. Control signal generator 40 generates control signals (C) during BIST and provides the control signals to BIST logic units 20a–b via control pipeline logic 30.

Figure 3:
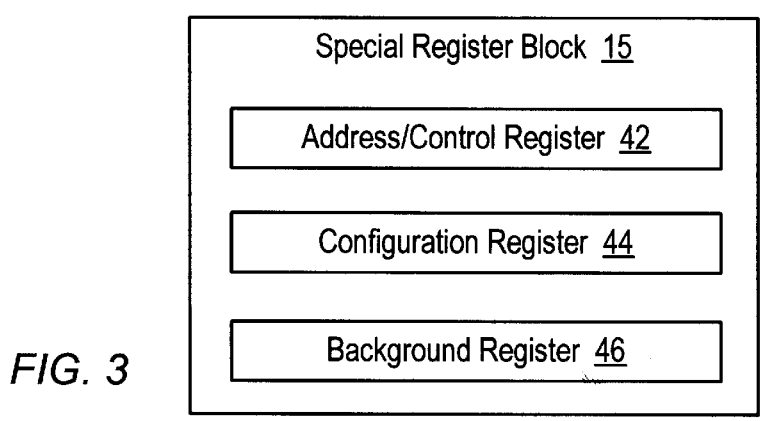
FIG. 3 is a block diagram of one embodiment of the special register block of FIG. 1, wherein the special register block includes an address/control register, a configuration register, and a background register.

FIG. 3 is a block diagram of one embodiment of special register block 15, wherein special register block 15 includes an address/control register 42, a configuration register 44, and a background register 46. Address/control register 42, configuration register 44, and background register 46 are addressable registers. Data may be stored in an addressable register by a write operation to an address assigned to the register, and data stored within the addressable register may be retrieved by a read operation to the address of the register.

FIGS. 4a–c are diagrams of exemplary embodiments of respective address/control register 42, configuration register 44, and background register 46 of FIG. 3. As described above, master test unit 18 uses programmable test data stored within address/control register 42, configuration register 44, and background register 46 of the special register block 15 during the programmable BIST routine. In the embodiment of FIG. 4a, address/control register 42 includes a write enable bit (bit 31), a port bit (bit 30), and an access field (bits 27–24). The write enable bit determines whether data is written to embedded memory units 16a–b (FIG. 1) during BIST. The port bit is used to select one of two ports of embedded memory units 16a–b (e.g., port 1 or port 2 of dual port embedded memory units 16a–b). The access ID field is used to initiate the programmable BIST routine. For example, writing the binary pattern "1001" (9h) into the access ID field (bits 27–24) may initiate programmable BIST testing.

In the embodiment of FIG. 4b, configuration register 44 includes a write vector field (bits 27–24), a read vector field (bits 19–16), an invert vector field (bits 11–8), a direction bit (bit 7), a length field (bits 5–4), and two most significant (i.e., highest ordered) bits of a 34-bit background pattern (bits 1–0). During BIST, data is written to and/or read from the rows of memory locations within embedded memory units 16a–b. The four bits of the write vector field determine when data is written to rows of embedded memory units 16a–b during BIST. Similarly, the four bits of the read vector field determine when data is read from rows of embedded memory units 16a–b. The four bits of the invert vector field determine when bits are inverted prior to write and/or compare operations during BIST. The direction bit (bit 7) determines whether row addresses are incremented or decremented during BIST. The length field specifies the total number of read and write operations performed during BIST. In the embodiment of FIG. 4c, background register 46 contains the 32 least significant (i.e., lowest ordered) bits of the 34 bit background pattern.

Figure 5A:
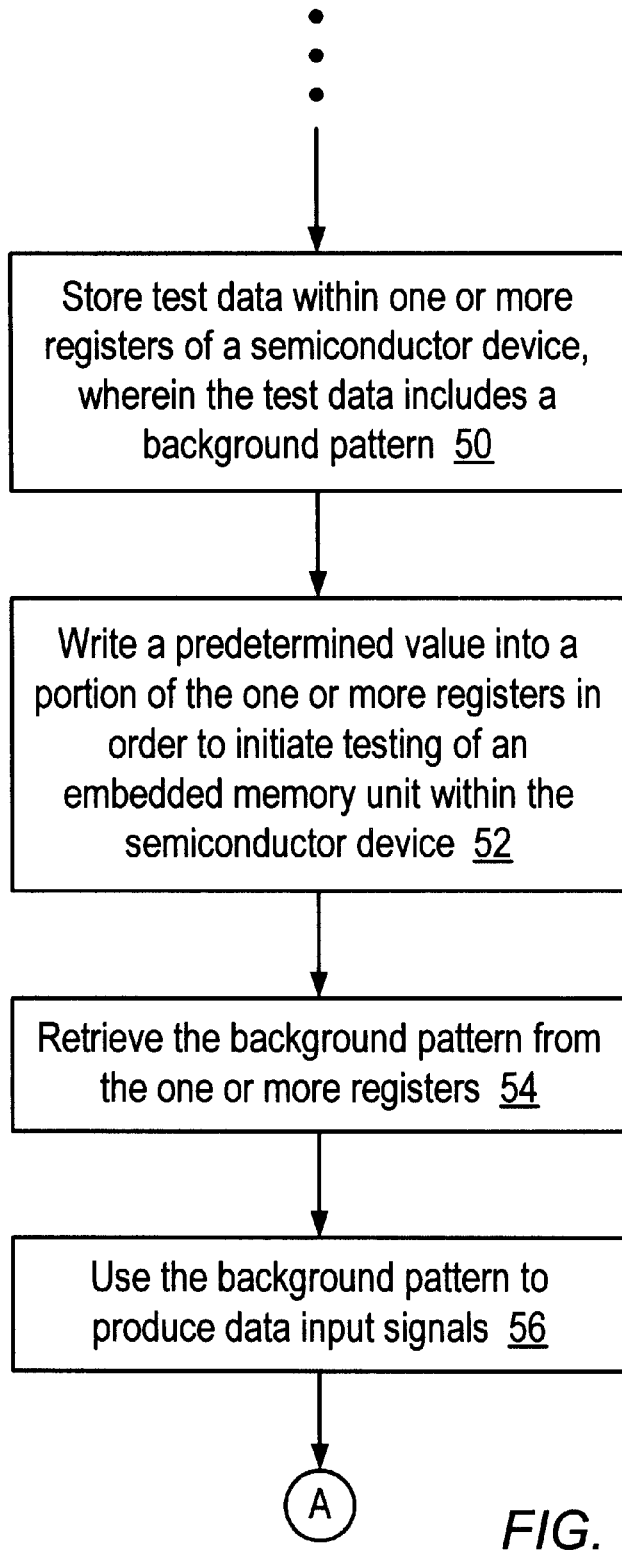
FIGS. 5a–b illustrate a flow chart of one embodiment of a method for testing an embedded memory unit of a semiconductor device.
Figure 5B:
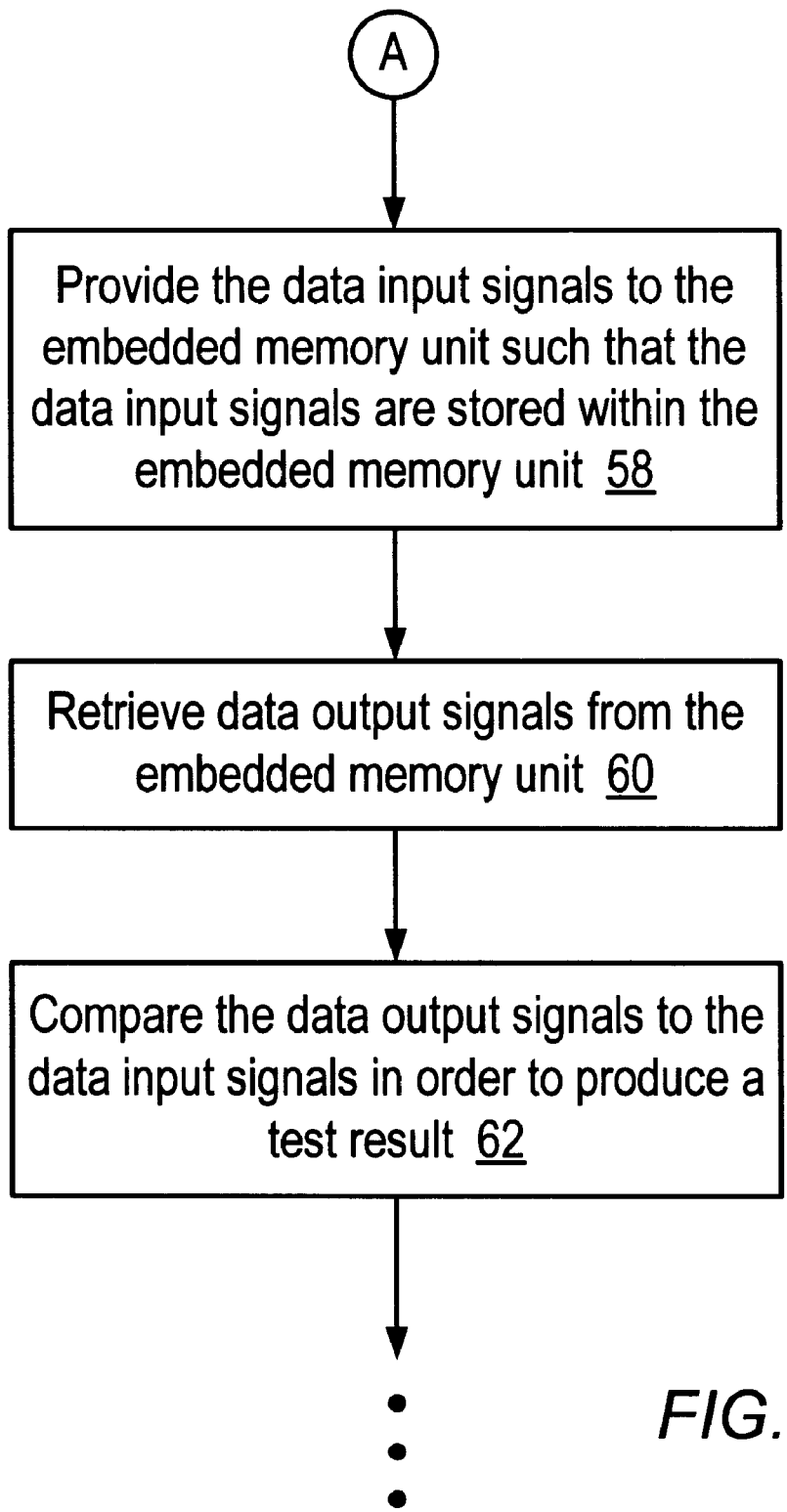

FIGS. 5a–b illustrate a flow chart of one embodiment of a method for testing an embedded memory unit of a semiconductor device. In a step 50, test data is stored within one or more registers of the semiconductor device, wherein the test data includes a background pattern. A predetermined value is written into a portion of the one or more registers in order to initiate testing of the embedded memory unit in a step 52. In a step 54, the background pattern is retrieved from the one or more registers. The background pattern is used to produce data input signals in a step 56. The data input signals are provided to the embedded memory unit such that the data input signals are stored within the embedded memory unit in a step 58. In a step 60, data output signals are retrieved from the embedded memory unit. The data output signals are compared to the data input signals in order to produce a test result in a step 62.

Figure 6:
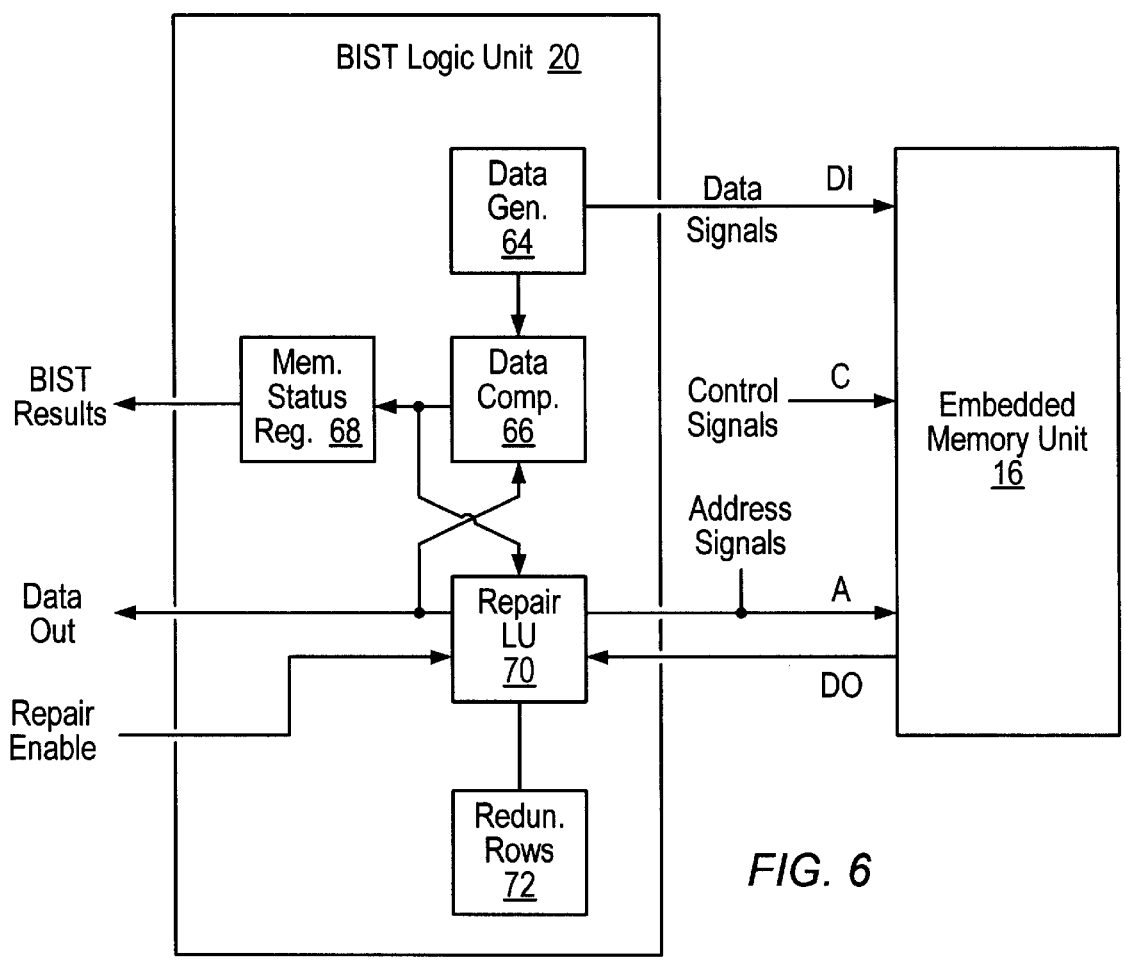
FIG. 6 is a block diagram of one embodiment of one of the BIST logic units of FIG. 1, wherein the BIST logic unit includes a data generator, a data comparator, a memory status register, a repair logic unit (LU), and redundant rows.

FIG. 6 is a block diagram of one embodiment of BIST logic unit 20 of FIG. 1, wherein BIST logic unit 20 includes a data generator 64, a data comparator 66, a memory status register 68, a repair logic unit (LU) 70, and redundant rows 72. Data generator 64 produces data signals from the background pattern stored therein, and provides the data signals to embedded memory unit 16 coupled thereto. Data generator 64 also provides the data signals to data comparator 66 as expected data.

Redundant rows 72 includes one or more redundant rows for replacing rows of embedded memory unit 16 which do not function correctly. Following reception of an address signal, repair logic unit 70 receives the data output (DO) signal from embedded memory unit 16 and a data output signal from redundant rows 72. Repair logic unit 70 produces the DATA OUT signal dependent upon a REPAIR ENABLE signal from master test unit 18 and provides the DATA OUT signal to data comparator 66. If the REPAIR ENABLE signal is deasserted, repair logic 70 produces the DATA OUT signal with the value of the DO signal from embedded memory unit 16. On the other hand, if the REPAIR ENABLE signal is asserted and a redundant row within redundant rows 72 is allocated to replace the accessed row within embedded memory unit 16, repair logic 70 produces the DATA OUT signal with the value of the data output signal from redundant rows 72.

Data comparator 66 compares the expected data from data generator 64 to the DATA OUT signal from repair logic unit 70, produces a single-bit comparison result, and provides the comparison result to memory status register 68. Memory status register 68 may combine the comparison result with other comparison results to form: (i) multiple bits indicating errors in different portions of embedded memory unit 16 (e.g., a macro of embedded memory unit 16), and/or (ii) a single bit indicating the status of the entire embedded memory unit 16. Memory status register 68 may store the single or multiple bit test result, and may provide the test result to master test unit 18.

Figure 7:
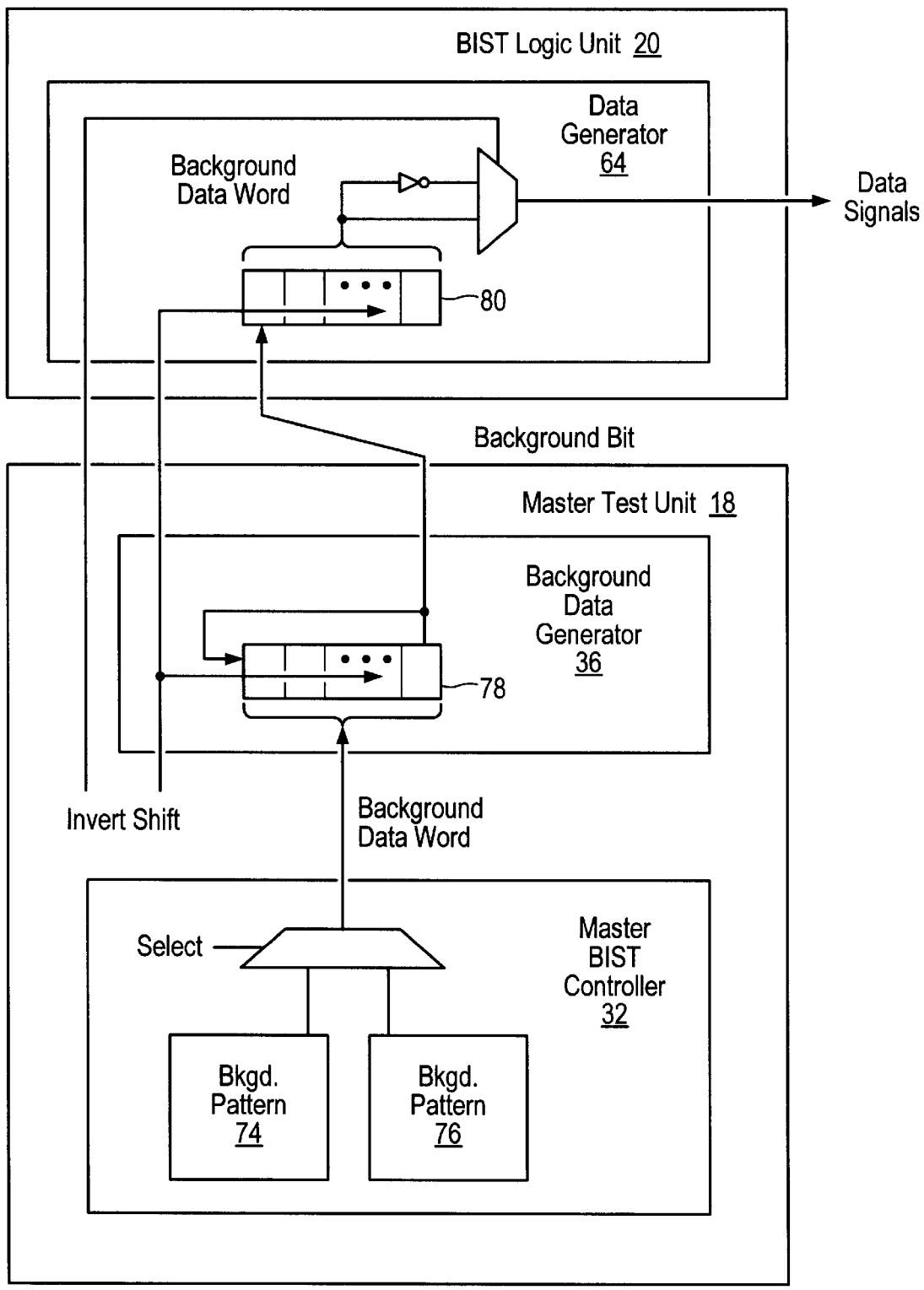
FIG. 7 is a diagram of the BIST logic unit of FIGS. 1 and 6 coupled to the master test unit of FIGS. 1 and 2 illustrating a preferred system and method for the transmitting of a background pattern from the background data generator of the master test unit to the BIST logic unit.

FIG. 7 is a diagram of BIST logic unit 20 of FIGS. 1 and 6 coupled to master test unit 18 of FIGS. 1 and 2 illustrating a preferred system and method for the transmitting of a background pattern from background data generator 36 of master test unit 18 to BIST logic unit 20. In FIG. 7, the background pattern is transmitted one bit after another in a serial fashion. Master BIST controller 32 of master test unit 18 selects either a background pattern 74 stored within hardwired BIST table 34 (the hardwired BIST routine) or a background pattern 76 stored within special register block 15 (the programmable BIST routine), and provides the background pattern 74/76 to background data generator 36 as a background data word. The background data word may have a length of, for example, 34 bits. Background data generator 36 stores the background data word in a background register 78.

In response to a SHIFT signal generated within master test unit 18, background register 78 produces the individual bits of the background data word stored therein one after another as a serial BACKGROUND BIT signal. Data generator 64 of BIST logic unit 20 receives the serial BACKGROUND BIT signal and the SHIFT signal, and stores the bits of the background data word conveyed by the BACKGROUND BIT signal within a background register 80 in response to the SHIFT signal. During BIST, data generator 64 produces the entire background data word as the data signals. Data generator 64 may invert the bits of the background data word in response to an INVERT signal from master test unit 18.

Figure 8:
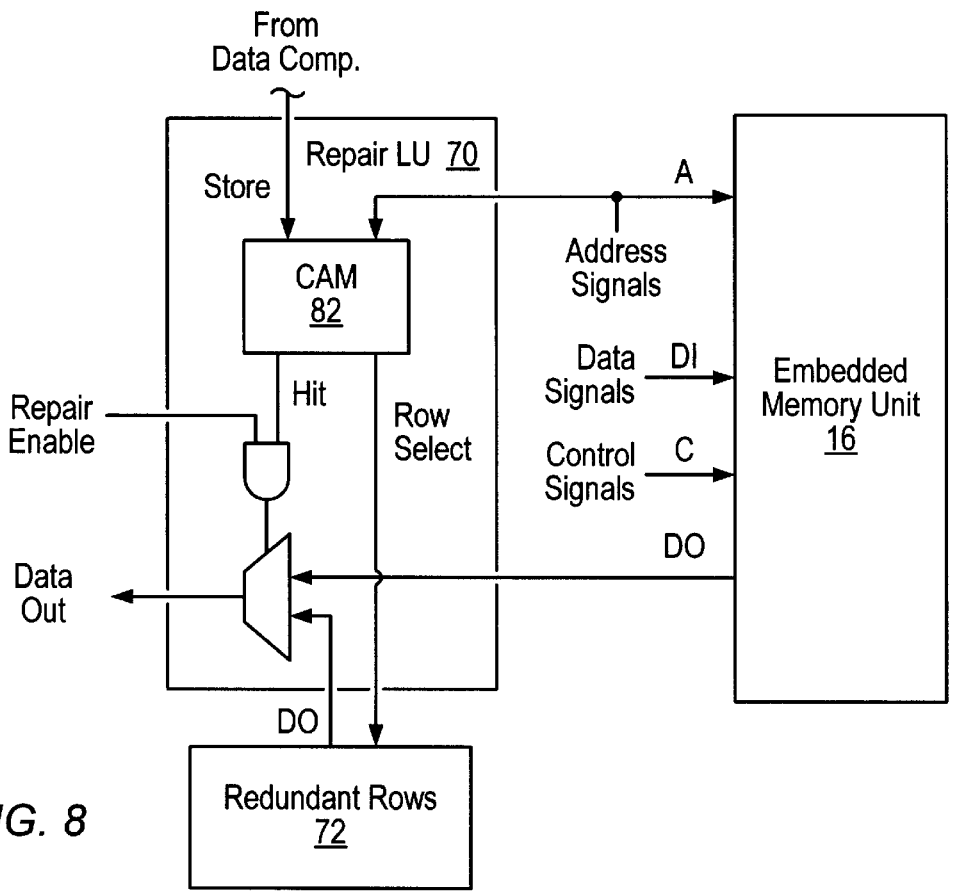
FIG. 8 is a diagram of one embodiment of the repair logic unit and the redundant rows of FIG. 6 illustrating an exemplary row repair mechanism.

FIG. 8 is a diagram of one embodiment of repair logic unit 70 and redundant rows 72 illustrating how a row repair mechanism may be implemented. During BIST, addresses of rows having at least one faulty memory location may be stored within a content addressable memory (CAM) 82 of repair logic unit 70. Each memory location within the CAM is associated with a different one of the redundant rows within redundant rows 72. Address signals (A) provided to embedded memory unit 16 are also provided to CAM 82. When the address signals match the contents of a memory location within CAM 82, CAM 82 produces an asserted HIT signal and a ROW SELECT signal indicating the row within redundant rows 72 associated with the memory location within CAM 82. In response to the address signals, embedded memory unit 16 produces a first data output (DO) signal. Redundant rows 72 produces the contents of the redundant row selected by the ROW SELECT signal as a second data output (DO) signal. Repair logic unit 70 selects between the first and second DO signals to produce the DATA OUT signal. When either the REPAIR ENABLE signal or the HIT signal is deasserted, repair logic unit 70 produces the first DO signal from embedded memory unit 16 as the DATA OUT signal. On the other hand, when the REPAIR ENABLE and HIT signals are both asserted, repair logic unit 70 produces the second DO signal from redundant rows 72 as the DATA OUT signal.

Figure 9:
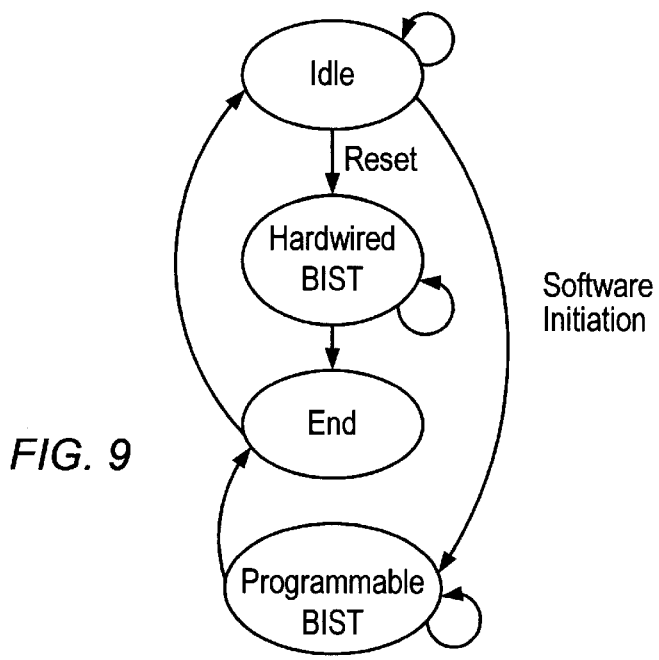
FIG. 9 is an exemplary state diagram of a state machine embodied within the master test unit of FIGS. 1 and 2.

FIG. 9 is an exemplary state diagram of a state machine embodied within master test unit 18. As described above, the hardwired BIST routine may be executed following assertion of the RESET signal, and the programmable BIST routine may be executed under software control (e.g., when access pattern "1001" (9h) is stored within the access ID field of the address/control register 42).

Figure 10:
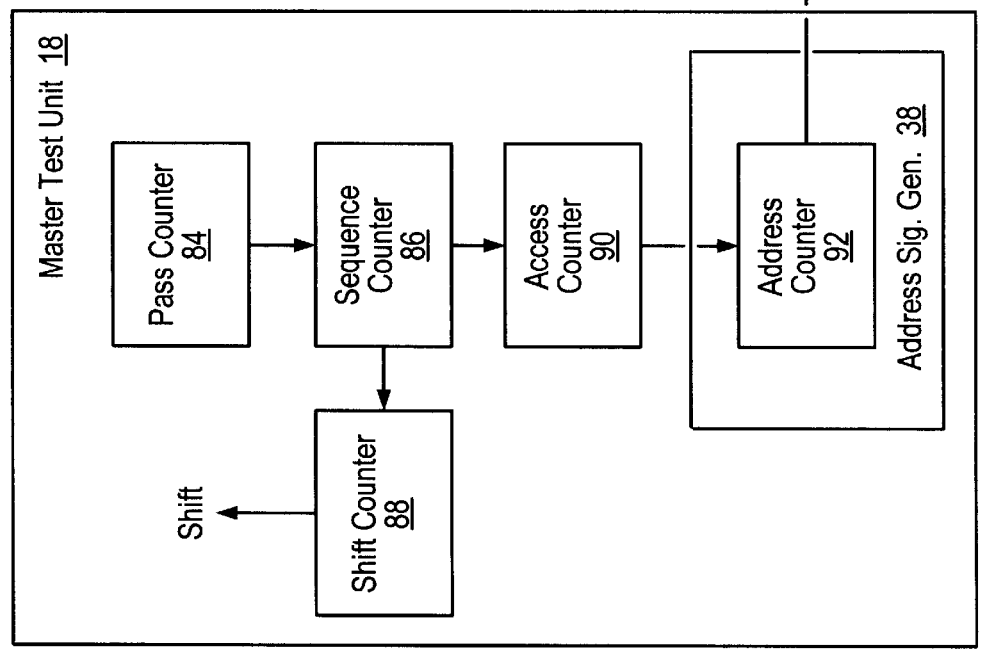
FIG. 10 is a block diagram of several functional units embodied within the master test unit of FIGS. 1 and 2, including a pass counter, a sequence counter, a shift counter, an access counter, and an address counter.

FIG. 10 is a block diagram of several functional units embodied within master test unit 18, including a pass counter 84, a sequence counter 86, a shift counter 88, an access counter 90, and an address counter 92.

Figure 11:
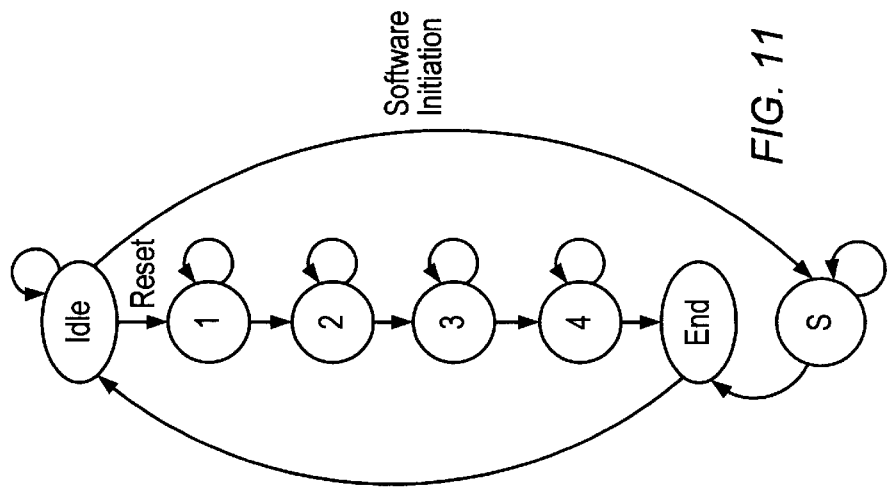
FIG. 11 is an exemplary state diagram of a state machine embodied within the pass counter of FIG. 10.

FIG. 11 is an exemplary state diagram of a state machine embodied within pass counter 84 of FIG. 10. The state diagram of FIG. 11 includes an idle state, hardwired BIST routine states 1–4, and end state, and a programmable BIST state "S". As described above, a hardware trigger event activated by software (e.g., by storing the binary pattern "1001" within the access ID field of address/control register 42) may cause a transition from the idle state to programmable BIST state "S".

Assertion of the RESET signal causes a transition from the idle state to state 1 of the hardwired BIST routine. In states 1 and 2, master test unit 18 may deassert the REPAIR ENBALE signal such that repairs of faulty rows of embedded memory units 16a–b are disabled. In state 1, the BIST system may perform a write recovery operation in which reads immediately follow writes to test adequate precharge of DRAM bit lines following the writes. Background patterns used in state 1 may include alternating 1s and 0s staggered from row to row within each embedded memory unit (e.g., "0101 . . . 01" stored in one row and "1010 . . . 10" stored in the next row) to form a checkerboard pattern. In state 2, the BIST system may perform more extensive memory array testing. Background patterns used in state 2 may include alternating sets of multiple 1s and 0s again staggered from row to row (e.g., "00110011 . . . 0011" stored in one row and "11001 100 . . . 1100" stored in the next row) to form a checkerboard pattern. States 1 and 2 may test port 1 of dual port embedded memory units 16a–b.

In states 3 and 4, master test unit 18 may assert the REPAIR ENBALE signal such that repairs of faulty rows of embedded memory units 16–b are enabled. In state 3 the BIST system may repeat the write recovery operation of state 1, and in state 4 the BIST system may repeat the more extensive memory array testing of state 2. States 3 and 4 may also test port 2 of dual port embedded memory units 16a–b.

Figure 12:
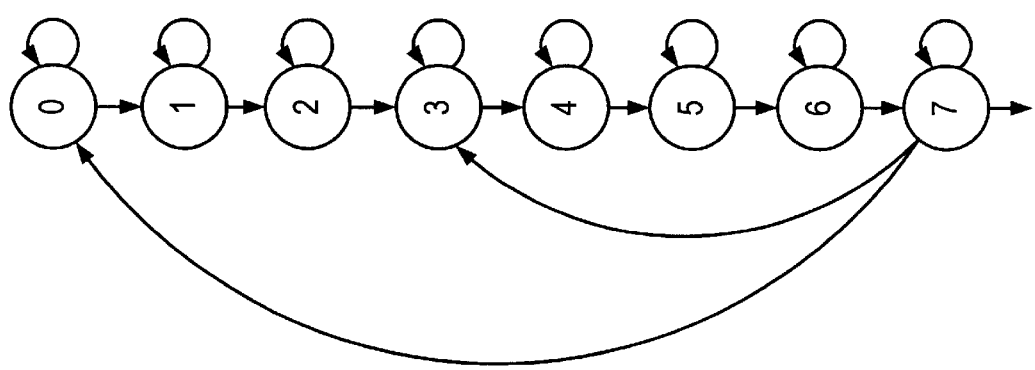
FIG. 12 is an exemplary state diagram of a state machine embodied within the sequence counter of FIG. 10.

FIG. 12 is an exemplary state diagram of a state machine embodied within sequence counter 86 of FIG. 10. The state diagram of FIG. 12 includes 8 states numbered 0–7. States 0–2 of FIG. 12 may be used to perform write recovery testing, and states 3–7 may be used to perform the hardwired BIST routine. Table 1 below lists exemplary actions performed in each state of sequence counter 86.

TABLE 1

Exemplary Actions Performed In Sequence Counter States.

| Sequence Counter State | Action |
|---|---|
| 0 | w |
| 1 | rW |
| 2 | Rw |
| 3 | w |
| 4 | rWR |
| 5 | Rwr |
| 6 | rWR |
| 7 | Rwr |

In Table 1, "w" signifies writing the background pattern, "r" signifies reading the background pattern, "W" signifies writing the inverted background pattern, and "R" signifies reading the inverted background pattern. For example, in state 0 of FIG. 12, the background pattern is written into each row of embedded memory units 16a–b. In state 1, the data stored in each row of the embedded memory unit during state 0 is read from embedded memory units 16a–b one row after another. After each row is read out, data comparator 66 (FIG. 6) compares the data retrieved from each row to the background pattern provided by data generator 64, thereby producing test results. Following the reading of each row, the background pattern is inverted and written into the row.

In state 2, the inverted data stored in each row of embedded memory units 16a–b during state 1 is again read from embedded memory units 16a–b in row-by-row fashion. After each row is read out, data comparator 66 compares the inverted data from each row to the inverted background pattern provided by data generator 64, and the resulting test results are provided to memory status register 68. Following each row read operation, the background pattern is again inverted and written to the row.

Figure 13:
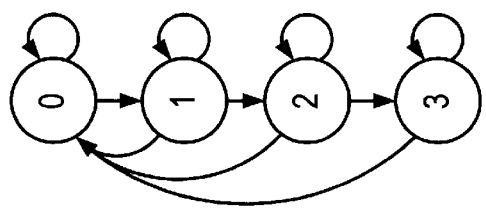
FIG. 13 is an exemplary state diagram of a state machine embodied within the access counter of FIG. 10.

FIG. 13 is an exemplary state diagram of a state machine embodied within access counter 90 of FIG. 10. The state diagram of FIG. 13 includes four states numbered 0–3. Access counter 90 includes a separate state for each read and write operation performed in each state of sequence counter 86. Having four separate states, access counter allows a total of four separate read and write operations during each state of sequence counter 86. Table 2 below lists exemplary states of access counter 90 corresponding to states of sequence counter 86.

TABLE 2

Exemplary Access Counter States Corresponding To Sequence Counter States.

| Sequence Counter State | Action | Access Counter States |
|---|---|---|
| 0 | w | 0 |
| 1 | rW | 0,1 |
| 2 | Rw | 0,1 |
| 3 | w | 0 |
| 4 | rWR | 0,1,2 |
| 5 | Rwr | 0,1,2 |
| 6 | rWR | 0,1,2 |
| 7 | Rwr | 0,1,2 |

Figure 14:
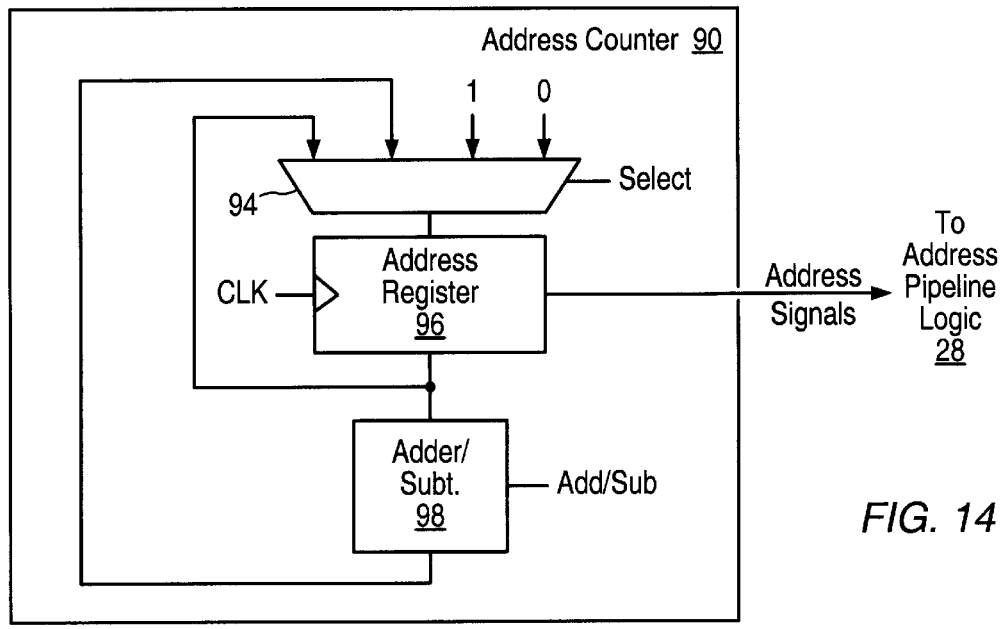
FIG. 14 is a diagram of one embodiment of the address counter of FIG. 10, wherein the address counter includes a multiplexer, an address register, and an adder/subtractor.

FIG. 14 is a diagram of one embodiment of address counter 90 of FIG. 10, wherein address counter 90 includes a multiplexer 94, an address register 96, and an adder/subtractor 98. The contents of address register 96 forms the address signals provided to address pipeline logic 28. Multiplexer 94 provides load values to address register 96, and selects between all 0s, all 1s, the current contents of address counter 96, and the output of adder/subtractor 98. Adder/subtractor 98 either increments or decrements the current contents of address register 96 dependent upon the value of an ADD/SUB signal.

Figure 15:
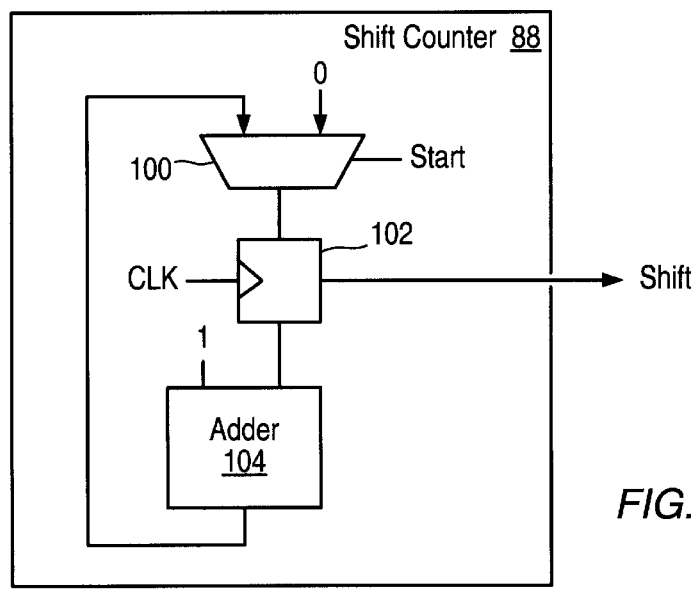
FIG. 15 is a diagram of one embodiment of the shift counter of FIG. 10.

FIG. 15 is a diagram of one embodiment of shift counter 88 of FIG. 10, wherein shift counter 88 includes a multiplexer 100, a shift cell 102, and an adder 104. The contents of shift cell 102 forms the SHIFT signal described above. Multiplexer 100 provides load values to shift cell 102, and selects between a 0 and the output of adder 104. Adder 104 increments the current contents of shift cell 102, thus producing a series of alternating 1s and 0s as the SHIFT signal.

Figure 16:
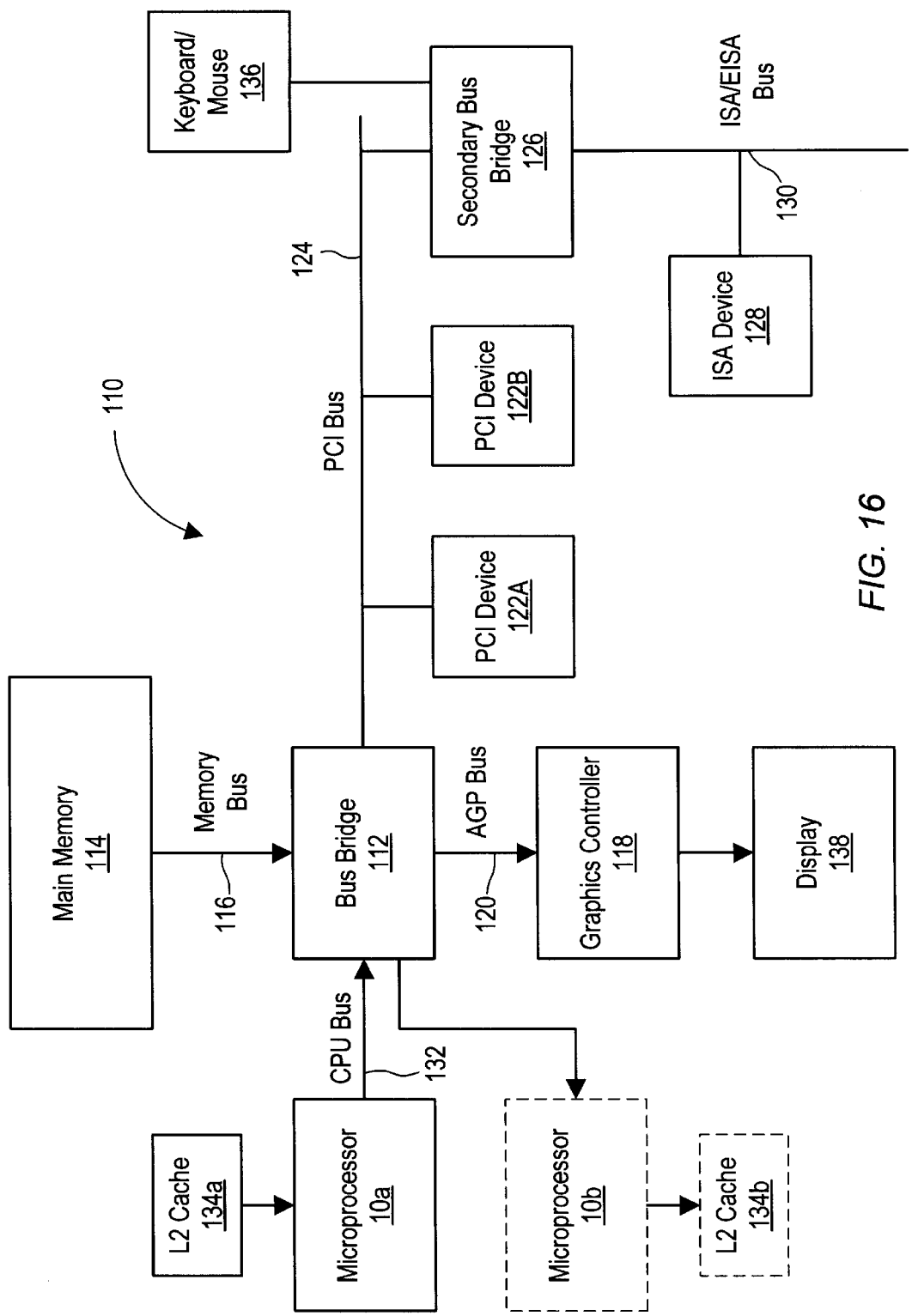
FIG. 16 is a block diagram of one embodiment of a computer system including the microprocessor of FIG. 1.

FIG. 16 is a block diagram of one embodiment of a computer system 110 including microprocessor 10 of FIG. 1. A first microprocessor 10a is coupled to a variety of system components through a bus bridge 112. Other embodiments of computer system 110 are possible and contemplated.

In the embodiment of FIG. 16, a main memory 114 is coupled to bus bridge 112 through a memory bus 116, and a graphics controller 1 18 is coupled to bus bridge 112 through an AGP bus 120. Multiple PCI devices 122A–B are coupled to bus bridge 112 through a peripheral component interconnect (PCI) bus 124. A secondary bus bridge 126 may further be provided to accommodate an electrical interface to one or more EISA or ISA devices 128 through an extended industry standard architecture (EISA)/industry standard architecture (ISA) bus 130. First microprocessor 10a is coupled to bus bridge 112 through a CPU bus 132 and to an optional L2 cache 134a.

Bus bridge 112 provides an interface between first microprocessor 10a, main memory 114, graphics controller 118, and devices attached to PCI bus 124. When an operation is received from one of the devices connected to bus bridge 112, bus bridge 112 identifies the target of the operation (e.g. a particular device or, in the case of PCI bus 124, that the target is on PCI bus 124). Bus bridge 112 routes the operation to the targeted device. Bus bridge 112 generally translates an operation from the protocol used by the source device or bus to the protocol used by the target device or bus.

In addition to providing an interface to an ISA/EISA bus for PCI bus 124, secondary bus bridge 126 may further incorporate additional functionality, as desired. An input/output controller (not shown), either external from or integrated with secondary bus bridge 126, may also be included within computer system 110 to provide operational support for a keyboard and mouse 136 and for various serial and parallel ports, as desired. An external cache unit (not shown) may further be coupled to CPU bus 132 between first microprocessor 10a and bus bridge 112 in other embodiments. Alternatively, the external cache may be coupled to bus bridge 112 and cache control logic for the external cache may be integrated into bus bridge 112. L2 cache 134a is further shown in a backside configuration to first microprocessor 10a. It is noted that L2 cache 134a may be separate from first microprocessor 10a, integrated into a cartridge (e.g. slot 1 or slot A) with first microprocessor 10a, or even integrated onto a semiconductor substrate with first microprocessor 10a.

Main memory 114 is used to store software instructions and data as described above. A suitable main memory 114 comprises dynamic random access memory (DRAM). For example, a plurality of banks of synchronous DRAM (SDRAM) or Rambus DRAM (RDRAM) may be suitable.

PCI devices 122A–B are illustrative of a variety of peripheral devices such as, for example, network interface cards, video accelerators, audio cards, hard or floppy disk drives or drive controllers, small computer systems interface (SCSI) adapters and telephony cards. Similarly, ISA device 128 is illustrative of various types of peripheral devices, such as a modem, a sound card, and a variety of data acquisition cards such as GPIB or field bus interface cards.

Graphics controller 118 is provided to control the rendering of text and images on a display 138. Graphics controller 138 may embody a typical graphics accelerator generally known in the art to render three-dimensional data structures which can be effectively shifted into and from main memory 114. Graphics controller 118 may therefore be a master of AGP bus 120 in that it can request and receive access to a target interface within bus bridge 112 to thereby obtain access to main memory 114. A dedicated graphics bus accommodates rapid retrieval of data from main memory 114. For certain operations, graphics controller 118 may further be configured to generate PCI protocol transactions on AGP bus 120. The AGP interface of bus bridge 112 may thus include functionality to support both AGP protocol transactions as well as PCI protocol target and initiator transactions. Display 138 is any electronic display upon which an image or text can be presented. A suitable display 138 includes a cathode ray tube ("CRT"), a liquid crystal display ("LCD"), etc.

It is noted that, while the PCI, AGP, and EISA/ISA buses have been used as examples in the above description, any bus architectures may be substituted as desired. It is further noted that computer system 110 may be a multiprocessing computer system including additional processors (e.g. a second microprocessor 10b shown as an optional component of computer system 110). Second microprocessor 10b may be similar to first microprocessor 10a, or second microprocessor 10b may be an identical copy of first microprocessor 10a. Second microprocessor 10b may be connected to bus bridge 112 via an independent bus (as shown in FIG. 16) or may share CPU bus 132 with first microprocessor 10a. Furthermore, second microprocessor 10b may be coupled to an optional L2 cache 134b similar to L2 cache 134a.

Numerous variations and modifications will become apparent to those skilled in the art once the above disclosure is fully appreciated. It is intended that the following claims be interpreted to embrace all such variations and modifications.

What is claimed is:

1. A semiconductor device, comprising:
a memory unit coupled to receive address signals, data input signals, and control signals, wherein the memory unit is configured to store the data input signals in response to a first set of address and control signals, and wherein the memory unit is configured to provide the stored data input signals as data output signals in response to a second set of address and control signals;
a built-in self-test (BIST) logic unit coupled to the memory unit and configured to store a memory test pattern;
a master test unit coupled to the BIST logic unit and to the memory unit, wherein the master test unit is configured to provide the memory test pattern to the BIST logic unit and to generate the first and second sets of address and control signals;
a special register block coupled to the master test unit, wherein the special register block includes at least one addressable register configured to store a programmable memory test pattern and an access ID code;
wherein in response to a predetermined access ID code within the at least one addressable register, the master test unit is configured to retrieve the programmable memory test pattern from the at least one addressable register for use as the memory test pattern provided to the BIST logic unit; and
wherein the BIST logic unit is further configured to produce the data input signals dependent upon the memory test pattern, to provide the data input signals to the memory unit, to receive the data output signals from the memory unit, and to compare the data output signals to the data input signals to form BIST results.

2. The semiconductor device as recited in claim 1, wherein the memory test pattern comprises a plurality of binary digits.

3. The semiconductor device as recited in claim 1, wherein the master test unit comprises a hardwired BIST table for storing unalterable BIST control data and an unalterable memory test pattern.

4. The semiconductor device as recited in claim 3, wherein in response to the semiconductor device receiving an asserted RESET signal, the master test unit is configured to: (i) retrieve the unalterable BIST control data and the unalterable memory test pattern from the hardwired BIST table, (ii) provide the unalterable memory test pattern to the BIST logic unit, and (iii) generate the first and second sets of address and control signals according to the unalterable BIST control data.

5. The semiconductor device as recited in claim 1 wherein the at least one addressable register is further configured to store BIST control data.

6. The semiconductor device as recited in claim 5, wherein in response to a predetermined access ID code within the at least one addressable register, the master test unit is further configured to: (i) retrieve the BIST control data from the at least one addressable register, and (ii) generate the first and second sets of address and control signals according to the BIST control data.

7. The semiconductor device as recited in claim 1, wherein the memory unit comprises a plurality of memory cells, and wherein the first and second sets of address and control signals generated by the master test unit cause a data input signal to be stored within and retrieved from, respectively, each of the plurality of memory cells of the memory unit at least once.

8. The semiconductor device as recited in claim 1, wherein the memory unit comprises a plurality of similar memory structures, and wherein the BIST logic unit comprises a redundant memory structure, and wherein the BIST logic unit is further configured to functionally replace a defective memory structure of the memory unit with the redundant memory structure dependent upon the BIST results.

9. The semiconductor device as recited in claim 8, wherein the memory unit comprises a plurality of row structures, and wherein the BIST logic unit comprises a redundant row structure, and wherein the BIST logic unit is configured to functionally replace a defective row structure of the memory unit with the redundant row structure dependent upon the BIST results.

10. A microprocessor, comprising:
a CPU core for executing instructions;
a plurality of memory units coupled to receive address signals, data input signals, and control signals, wherein each of the memory units is configured to store the data input signals in response to a first set of address and control signals, and wherein each of the memory units is configured to provide the stored data input signals as data output signals in response to a second set of address and control signals;
a plurality of built-in self-test (BIST) logic units, wherein each of the BIST logic units is coupled to a different one of the memory units and comprises a background register;

a master test unit coupled to the BIST logic units and to the memory units;

a special register block coupled between the CPU core and the master test unit, wherein the special register block comprises at least one addressable register;

wherein the CPU core is configured to produce a memory test pattern during instruction execution and to store the memory test pattern within the at least one addressable register of the special register block;

wherein the master test unit is configured to retrieve the memory test pattern from the special register block, to provide the memory test pattern to each of the BIST logic units, and to generate the first and second sets of address and control signals; and wherein each of the BIST logic units is further configured to receive the memory test pattern, to store the memory test pattern within the background register, to produce the data input signals dependent upon the memory test pattern, to provide the data input signals to the memory unit coupled thereto, to receive the data output signals from the memory unit coupled thereto, and to compare the data output signals to the data input signals to form BIST results.

11. The microprocessor as recited in claim 10, wherein the CPU core is further configured to produce an access ID code during instruction execution and to store the access ID code within the at least one addressable register of the special register block.

12. The microprocessor as recited in claim 11, wherein in response to the CPU core storing a predetermined access ID code within the at least one addressable register, the master test unit is configured to: (i) retrieve the memory test pattern from the special register block, (ii) provide the memory test pattern to each of the BIST logic units, and (iii) generate the first and second sets of address and control signals.

13. The microprocessor as recited in claim 12, wherein the CPU core is further configured to produce BIST control data during instruction execution and to store the BIST control data within the at least one addressable register.

14. The microprocessor as recited in claim 13, wherein master test unit is further configured to retrieve the BIST control data from the at least one addressable register, and wherein the master test unit generates the first and second sets of address and control signals according to the BIST control data.

15. The microprocessor as recited in claim 10, wherein each memory unit comprises a plurality of similar memory structures, and wherein each BIST logic unit further comprises a redundant memory structure, and wherein each BIST logic unit is further configured to functionally replace a defective memory structure of the memory unit coupled thereto with the redundant memory structure dependent upon the BIST results.

16. The microprocessor as recited in claim 15, wherein each memory unit comprises a plurality of row structures, and wherein each BIST logic unit further comprises a redundant row structure, and wherein each BIST logic unit is further configured to functionally replace a defective row structure of the memory unit coupled thereto with the redundant row structure dependent upon the BIST results.

17. A method for testing a memory unit of a semiconductor device, comprising:

storing test data within at least one register of the semiconductor device, wherein the test data includes a memory test pattern;

writing a predetermined value into a portion of the at least one register in order to initiate testing of the memory unit;

retrieving the memory test pattern from the at least one register;

using the memory test pattern to produce data input signals;

providing the data input signals to the memory unit;

storing the data input signals within the memory unit;

retrieving data output signals from the memory unit; and comparing the data output signals to the data input signals in order to produce a test result.

18. A computer system, comprising:

a microprocessor, comprising:

a CPU core for executing instructions;

a plurality of memory units coupled to receive address signals, data input signals, and control signals, wherein each of the memory units is configured to store the data input signals in response to a first set of address and control signals, and wherein each of the memory units is configured to provide the stored data input signals as data output signals in response to a second set of address and control signals;

a plurality of built-in self-test (BIST) logic units, wherein each of the BIST logic units is coupled to a different one of the memory units and comprises a background register;

a master test unit coupled to the BIST logic units and to the memory units;

a special register block coupled between the CPU core and the master test unit, wherein the special register block comprises at least one addressable register;

wherein the CPU core is configured to produce a memory test pattern during instruction execution and to store the memory test pattern within the at least one addressable register of the special register block;

wherein the master test unit is configured to retrieve the memory test pattern from the special register block, to provide the memory test pattern to each of the BIST logic units, and to generate the first and second sets of address and control signals; and wherein each of the BIST logic units is further configured to receive the memory test pattern, to store the memory test pattern within the background register, to produce the data input signals dependent upon the memory test pattern, to provide the data input signals to the memory unit coupled thereto, to receive the data output signals from the memory unit coupled thereto, and to compare the data output signals to the data input signals to form BIST results.

19. The computer system as recited in claim 18, further comprising:

a bus coupled to the microprocessor, and a peripheral device coupled to the bus.

20. The computer system as recited in claim 19, wherein the bus is a peripheral component interconnect (PCI) bus, and wherein the peripheral device is selected from the group consisting of: a network interface card, a video accelerator, an audio card, a hard disk drive, and a floppy disk drive.

21. The computer system as recited in claim 19, wherein the bus is an extended industry standard architecture (EISA)/ industry standard architecture (ISA) bus, and wherein the peripheral device is selected from the group consisting of: a modem, a sound card, and a data acquisition card.

* * * * *